United States Patent [19]

Britton, Jr. et al.

[11] Patent Number: 4,866,400
[45] Date of Patent: Sep. 12, 1989

[54] AUTOMATIC POLE-ZERO ADJUSTMENT CIRCUIT FOR AN IONIZING RADIATION SPECTROSCOPY SYSTEM

[75] Inventors: Charles L. Britton, Jr., Alcoa; Thomas H. Becker; Michael O. Bedwell, both of Knoxville, all of Tenn.

[73] Assignee: Ortec Incorporated, Oak Ridge, Tenn.

[21] Appl. No.: 144,119

[22] Filed: Jan. 15, 1988

[51] Int. Cl.$^4$ .............................................. H03F 1/00
[52] U.S. Cl. ................................. 330/305; 250/369; 328/167
[58] Field of Search ................. 330/107, 305; 328/167, 328/162; 250/369

[56] References Cited

U.S. PATENT DOCUMENTS 4,481,466 11/1984 Roos et al. .................... 330/107 X
4,491,799 1/1985 Giardinelli ....................... 330/2

OTHER PUBLICATIONS

Nowlin et al., "Elimination of Undesirable Undershoot in the Operation and Testing of Nuclear Pulse Amplifiers", Rev. Sci. Instr., Instr., vol. 36, No. 12, Dec. 1965, pp. 1830–1839.
Casoli et al., "Active Pole-Zero Cancellation Feedback Loop to Enhance High-Rate Performances of Nuclear Spectroscopy Systems", Nucl. Inst. and Meth., vol. 156, 1978, pp. 559–566.
Cora et al., "Automated Regulation of Critical Parameters and Related Design Aspects of Spectroscopy Amplifiers with Time-Invariant Filters", I.E.E.E. Trans. on Nucl. Sci., NS-29(1), Feb. 1982, pp. 609–613.

Primary Examiner—James B. Mullins
Attorney, Agent, or Firm—Finnegan, Henderson, Farabow, Garrett & Dunner

[57] ABSTRACT

An automatic pole-zero adjustment circuit is provided for an ionizing radiation spectroscopy system which comprises a pole-zero network circuit, coupled to the system and having an electrical chracteristic which varies as a function of an input control signal, for permitting pole-zero adjustment of the system; a sampling circuit coupled to the system, for sampling a segment of the trailing edge of random pulses passing through the system; and a control signal circuit coupled to the sampling circuit, for generating the input control signal as a function of the sampling to permit cancellation by the pole-zero network circuit of undershoot in the system. The pole-zero network circuit may include a real pole in the signal path of the network circuit set coincident with the real pole of a high pass filter in the system itself. The control signal provided to the pole-zero network circuit is digitized.

12 Claims, 4 Drawing Sheets

AUTOMATIC POLE-ZERO ADJUSTMENT CIRCUIT FOR AN IONIZING RADIATION SPECTROSCOPY SYSTEM

BACKGROUND OF THE INVENTION

I. Field of the Invention

The present invention is directed toward an ionizing radiation spectroscopy system having a circuit which provides for automatic pole-zero adjustment of that system.

II. Backqround Information

In a typical ionizing radiation spectroscopy system, such as the prior art system 10 illustrated in FIG. 1, incident X-ray, α-ray or alpha-ray radiation from a radiation source 12 is directed toward an ionizing radiation detector 14. The ionized radiation liberates charge in the form of electron-hole pairs in an electric field within detector 14, which preferably is of a solid state variety.

In addition to detector 14, system 10 includes a preamplifier 16, a high pass filter 18, which includes a capacitor C[1] and a resistor R[1], an amplifier section 20, including an amplifier stage 22 having a feedback resistor and a second stage amplifier/filter 24, and a display 26. The output of detector 14 is coupled to an input of preamplifier 16, whereas the output of preamplifier 16 is connected, through high pass filter 18, to a summing input of amplifier 22, the output of which is connected to the input of amplifier/filter 24. The output of amplifier/filter 24 is connected to the input of display 26. Display 26 comprises a multichannel pulse-height analyzer (MCA) which analyzes and displays the output of amplifier section 20.

In operation of system 10, charge is collected on the detector electrodes of detector 14 to produce an output current pulse with a total charge which is proportional to the energy of the radiation absorbed by detector 14. Preamplifier 16 is charge sensitive and integrates this current pulse to produce a corresponding voltage pulse e[pa](t). Succeeding amplifier 22 and amplifier/filter 24 provide shaping for signal-to-noise enhancement. The peak amplitudes of the processed pulses are digitalized by an analog-to-digital converter within display 26 and a resultant pulse-height distribution is displayed by display 26. This pulse-height distribution may also be stored in memory for later analysis. The value of capacitor C[1] and/or resistor R[] may be changed to alter the time constant of filter 18.

System 10 of FIG. 1 must add minimum noise to the signal output from detector 14 and must be able to process that signal in the shortest possible time. Preamplifier 16 is optimized for minimum noise. Amplifier 20 provides additional gain and optimized filtering in order to achieve maximum reduction of the preamplifier and detector noise contributions with minimum processing time.

Preamplifier 16 represents a low pass filter with a typical time constant of 50 us to 1 ms. The impulse response of preamplifier 16 is, therefore, a voltage step followed by a decaying exponential, e[pa](t) as shown in FIG. 2. The subsequent high pass filter 18 and amplifier 20 act to differentiate the preamplifier pulse and introduce additional poles at relatively short time constants. The simpliest differentiating network, a high pass filter comprising capacitor C[1] and R[1], has a zero at the origin of the S plane. The use of high pass filter 18 with an exponentially decaying preamplifier signal, such as e[pa](t), produces an undesirable undershoot in the resultant signal E(1)(t), as shown in FIG. 3. Undershoot, as shown in FIG. 3, results in a very long pulse processing times, thus aggrevating pulse-pile up, i.e., the interference by one pulse on the system amplitude determination of successive pulses. In addition, uncompensated singularities, namely the pole of preamplifier 16 and the zero of high pass filter 18, can have a detrimental effect on the noise performance of the overall spectroscopy chain of system 10.

A technique to completely cancel undershoot resulting from high pass filtering of a preamplifier output signal is disclosed by Nowlin et al. in an article entitled "Elimination of Undesirable Undershoot in the Operation and Testing of Nuclear Pulse Amplifiers," Rev. Sci. Instr., Vol. 36, No. 12, December 1965, pp. 1830–1839, the contents of which are incorporated herein by reference. This technique is commonly called pole-zero cancellation. In the differentiation network comprising high pass filter 18, or the electrical equivalent thereof, the zero at the origin of the S-plane is shifted to a location coincident with the pole from the preamplifier. One illustrative network often used for pole-zero cancellation is illustrated in FIG. 4 as comprising resistor R[2] and resistor R[3] coupled to a high pass filter comprising capacitor C[1] and resistor R[1]. As should be apparent to one skilled in the art, by using the network of FIG. 4, an attenuated replica of the output signal from preamplifier 16 may be added to the differentiated signal from the output of high pass filter 18 to exactly cancel the undershoot illustrated in FIG. 3. The resultant output voltage from high pass filter 18, e[1](t) is illustrated in FIG. 5. It should also be apparent to one skilled in the art that the high pass filter 18 of FIG. 1, with capacitor C[1] and resistor R[1] in series, is electrically equivalent to the high pass filter illustrated in FIG. 4 also comprising capacitor C[1] and resistor R[1].

Other configurations have been used in the prior art to accomplish pole-zero cancellation, as is evidenced by the article by Casoli et al. entitled "Active Pole-Zero Cancellation Feedback Loop to Enhance High-Rate Performances of Nuclear Spectroscopy Systems," Nucl. Inst. and Meth., Vol. 156, 1978, pp. 559–566, the contents of which is also incorporated herein by reference.

In order to optimize system performance for a given preamplifier-filter-amplifier combination, the pole-zero adjustment is critical. This adjustment is typically performed by a skilled operator by means of an oscilloscope as evidenced by the above-mentioned Casoli et al. article. The pole-zero adjustment is made difficult due to the follow factors: (1) the noise at the output of the amplifier obscures the effects of any adjustment for undershoot; (2) the vertical gain of the oscilloscope must be limited to avoid distortion caused by overload or the input signal must be limited by a resistor-diode clamping network; and (3) the statistical amplitude distribution of the amplifier output pulses masks effects of the pole-zero adjustments. Considerable operator skill is required to make a pole-zero adjustment which results in adequate system performance.

In 1982, in an article by Cova et al. entitled "Automated Regulation of Critical Parameters and Related Design Aspects of Spectroscopy Amplifiers with Time-Invariant Filters," I.E.E.E. Trans. on Nucl. Sci., NS-29(1), Feb. 1982, pp. 609–613, a circuit was introduced for assisting in manually adjusting a pole-zero cancellation circuit. A similar disclosure appears in U.S. Pat. No. 4,491,799 issued to Giardinelli. The content of both these documents is incorporated herein by reference.

The circuit disclosed by Cova et al. and Giardinelli eliminates the need for an oscilloscope, eliminates the need for a limiting network and reduces the skill required in pole-zero adjustment of the system. The circuit comprises a boxcar averager, two light-emitting diodes (LEDs), and associated control circuitry. The boxcar averager is used to sample the base line at the output of the amplifier, such as the output of amplifier 20 of FIG. 1, after each pulse which is validly detected by detector 14. The LEDs are then used to indicate whether the resultant pulse, e[1](t), possesses an undershoot as shown in FIG. 3 or an overshoot, with one of the LEDs being lit in the presence of an undershoot, and the other of the LEDs being lit in the presence of an overshoot. Adjustment is then made in a pole-zero compensation circuit of the type illustrated in FIG. 4, until both LEDs are turned off. However, with this technique the setting of pole-zero compensation is still a manual adjustment, requiring the operator to turn a potentiameter until proper compensation is achieved.

An object of the present invention is to provide an automatic pole-zero adjustment circuit for an ionizing radiation spectroscopy system.

Additional objects and advantages of the present invention will be set forth in part in the description which follows, and in part will be obvious from the description or may be learned by practice of the invention.

SUMMARY OF THE INVENTION

To achieve the foregoing objects, and in accordance with the purposes of the invention, as embodied and broadly described herein, an automatic pole-zero adjustment circuit is provided for an ionizing radiation spectroscopy system comprising a pole-zero network circuit, coupled to the system and having an electrical characteristic which varies as a function of an input control signal, for permitting pole-zero adjustment of the system; a sampling circuit, coupled to the system, for sampling a segment of the trailing edge of random pulses passing through the system, and a control signal circuit, coupled to the sampling circuit, for generating the input control signal as a function of the sampling to permit cancellation of undershoot in the system by the pole-zero network circuit. Preferably the sampling circuit comprises a boxcar averager circuit, the electrical characteristic of the pole-zero network circuit is resistance, and the pole-zero network circuit comprises a Multiplying Digital-To-Analog Converter (MDAC).

More specifically, and preferably, the pole-zero network circuit includes an input buffer amplifier coupled to the input of the MDAC and an output buffer coupled to the output of the MDAC. As noted above, prior art systems include a high pass filter and, preferably, the pole-zero network circuit of the subject invention includes a circuit coupled to the input amplifier, having a time constant equal to the time constant of the high pass filter.

As was also noted above, prior art ionization spectroscopy systems have a real pole of a high pass filter in the signal path of the system. In accordance with the present invention there is preferably a pole-zero network circuit, coupled to the system, for permitting pole-zero adjustment of the system in response to an input control signal, with the network circuit including a real pole in the signal path of the network circuit set coincident with the real pole of the high pass filter. The pole-zero network circuit of the subject invention also preferably comprises an input buffer amplifier, a multiplying digital-to-analog converter (MDAC) and an output buffer amplifier connected in series with one another, wherein the input buffer amplifier includes a circuit to establish the above-mentioned real pole in the signal path of the network circuit.

Still further, the system of the subject invention preferably includes a first mechanism for changing the real pole of the high pass filter and the network circuit includes a second mechanism, responsive to operation of the first mechanism, for correspondingly changing the real pole of the signal path of the network circuit.

BRIEF DESCRIPTION OF THE DRAWINGS

The accompanying drawings, which are incorporated in and constitute a part of the specification, illustrate examples of the preferred embodiment of the invention and, together with the general description of the invention given above and a detailed description of the preferred embodiments given below, serve to explain the principles of the invention.

DETAILED DESCRIPTION OF THE PREFERRED EMBODIMENT

Figure 1:
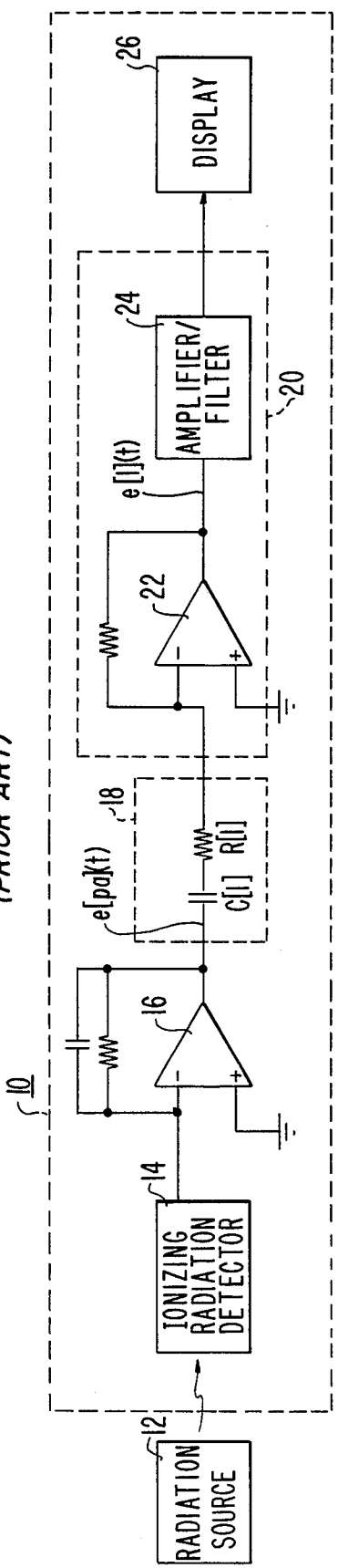
FIG. 1 is a block diagram of a prior art ionizing radiation spectroscopy system.
Figure 2:
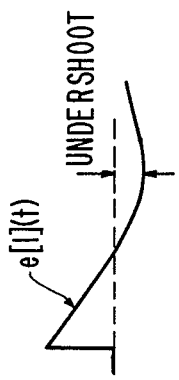
FIG. 2 is a diagram of the voltage step output of the preamplifier of the prior art system of FIG. 1.

In the prior art system 10 illustrated in FIG. 1, an output voltage pulse e[pa](t) is provided at the output of preamplifier 16, with:

$$e[pa](t) = E[max] * exp(-t/T[pa]) \ldots \qquad (1)$$

wherein T[pa] is the time constant of preamplifier 16. The Laplace Transform of e[pa](t) yields E[pa](s), wherein:

$$E[pa](s) = \frac{E[max]}{s + 1/T[pa]} . \qquad (2)$$

The output of high pass filter 18 may be represented by E[1](s), with:

$$E[1](s) = \frac{E[\max] * s}{(s + 1/T[pa]) * (s + 1/t[1])}, \qquad (3)$$

and conversion of E[1](s) back to time domain yields:

$$e[1](t) = \frac{E[\max] * T[pa] * \exp(-t/T[1]) - T[1] * \exp(-t/T[pa])}{(T[pa] - T[1])}, \qquad (4)$$

$$\text{where } T[1] = R[1] * C[1]. \qquad (5)$$

As indicated in Equation 3, system 10 at the output of high pass filter 18 has one "zero" represented by "s" in the numerator and two "poles" represented by the terms (s +1/T[pa]) and (s+1/t[1]) in the denominator.

Figure 4:
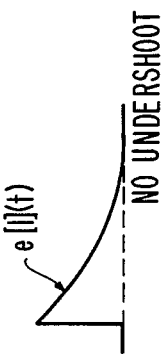
FIG. 4 is a circuit diagram of a prior art pole-zero compensation circuit.
Figure 3:
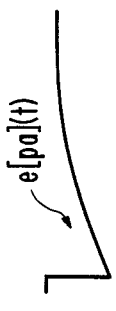
FIG. 3 is a diagram of the voltage step output of the amplifier of the prior art system of FIG. 1.
Figure 5:
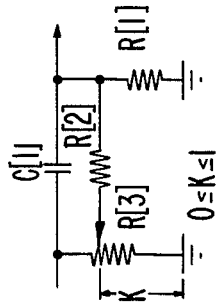
FIG. 5 is a diagram of the voltage step output of the amplifier of the prior art system of FIG. 1 using the pole-zero compensation circuit of FIG. 4.

An object of the pole-zero cancellation network illustrated in FIG. 4 is to provide pole-zero cancellation with regard to the poles and zeros present in Equation 3. Specifically, with regard to the network illustrated in FIG. 4, E[1](s) may be represented as:

$$E[1](s) = \frac{E[\max] * s + K/(R[2] * C[1])}{(s + 1/T[pa]) * (s + 1/T[p])}, \qquad (6)$$

$$\text{where } T[p] = \frac{C[1] * R[1] * R[2]}{R[1] + R[2]}. \qquad (7)$$

Proper pole-zero cancellation is achieved when:

$$T[pa] = R[2] * C[1]/K. \qquad (8)$$

Thus, $$E[1](s) = \frac{E[\max]}{s + 1/T[p]}, \qquad (9)$$

and $$e[1](t) = E[\max] * \exp(-t/T[p]). \qquad (10)$$

As may be seen by a comparison of E[1](s) in Equation 3 and in Equation 9, one pole and one zero have been cancelled using the network of FIG. 4.

Reference will now be made in detail to the present preferred embodiment of the subject invention as illustrated in the accompanying drawings.

Figure 6:
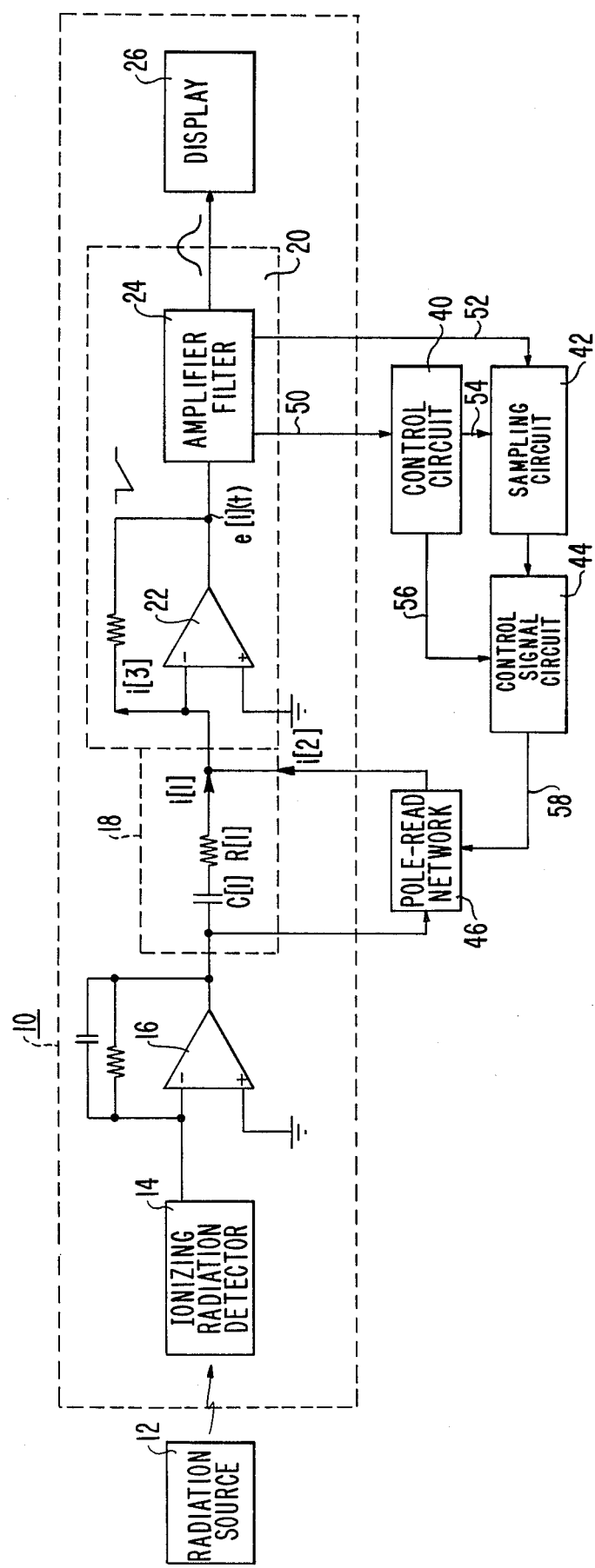
FIG. 6 is a block diagram of an automatic pole-zero adjustment circuit for an ionizing radiation spectroscopy system incorporating the teachings of the present invention.

In FIG. 6, a control circuit 40, sampling circuit 42, control signal circuit 44, and pole-zero network 46 are shown coupled to a prior art ionizing radiation spectroscopy system 10 of the type illustrated in FIG. 1. Control circuit 40 has an input line 50 coupled from amplifier/filter 24 which receives a sampled output of amplifier 24 prior to any low pass filtering by amplifier/filter 24 so as to provide an identification pulse for operation within control circuit 40. Sampling circuit 42 has an input line 52 from amplifier/filter 24 which receives output signal provided by amplifier/filter 24 but which, preferably, has been clamped. Control circuit 40 has output lines 54 and 56 coupled to control sampling circuit 42 and control signal circuit 44, respectively, as is described in more detail below. The output of sampling circuit 42 is provided to the input of control signal circuit 44. The output of control signal circuit 44 is provided over line 58, in the form of an input control signal, to pole-zero network 46. Pole-zero network 46 is, in the preferred embodiment of FIG. 6, coupled across high pass filter 18 of system 10. As will be described in more detail below, pole-zero network 46 includes an electrical characteristic, such as resistance, which varies as a function of the input control signal on line 58, to permit pole-zero adjustment of system 10.

Sampling circuit 42 operates to sample a segment of the trailing edge of random pulses passing through system 10. Sampling circuit 42, in the preferred embodiment of the present invention, comprises a standard boxcar averager circuit of the type illustrated in the Cova et al. article and the Giardinelli patent referred to above. The output of sampling circuit 42, accordingly, has an amplitude representative of the sampled preselected intervals of the trailing edge for a plurality of validly detected random pulses from system 10. This output signal amplitude is a weighted average of the trailing edges in these sampled intervals.

Control circuit 40 operates, as should be apparent to one skilled in the art, to govern the timing of sampling circuit 42 to assure that only a predetermined segment of the trailing edge of each validly detected random pulse is sampled by sampling circuit 42. The operation of the present invention is not dependent upon the particular configuration of sampling circuit 42, or the particular manner in which sampling circuit 42 is connected to the amplifier/filter chain of system 10. All that is required is that sampling circuit 42 operate to sample a segment of the trailing edge of valid events detected by system 10.

Figure 7:
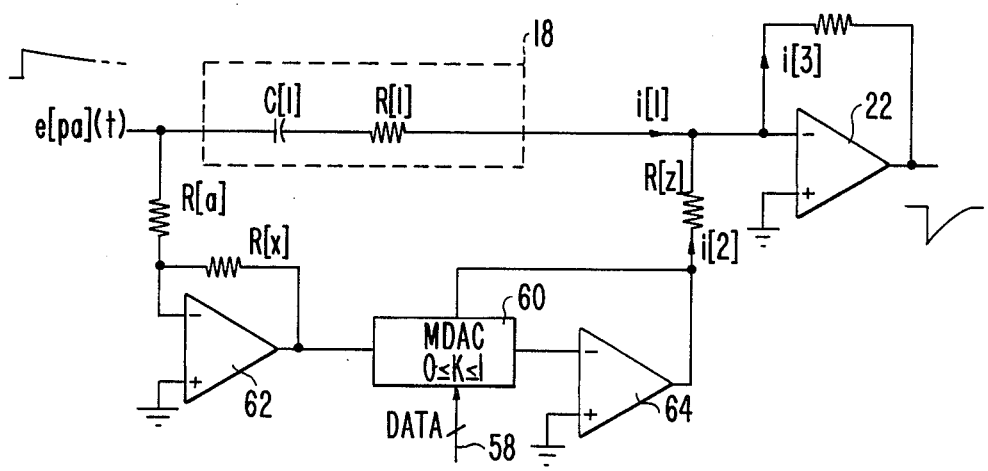
FIG. 7 is a circuit diagram of a preferred embodiment of the pole-zero network of FIG. 6.
Figure 8:
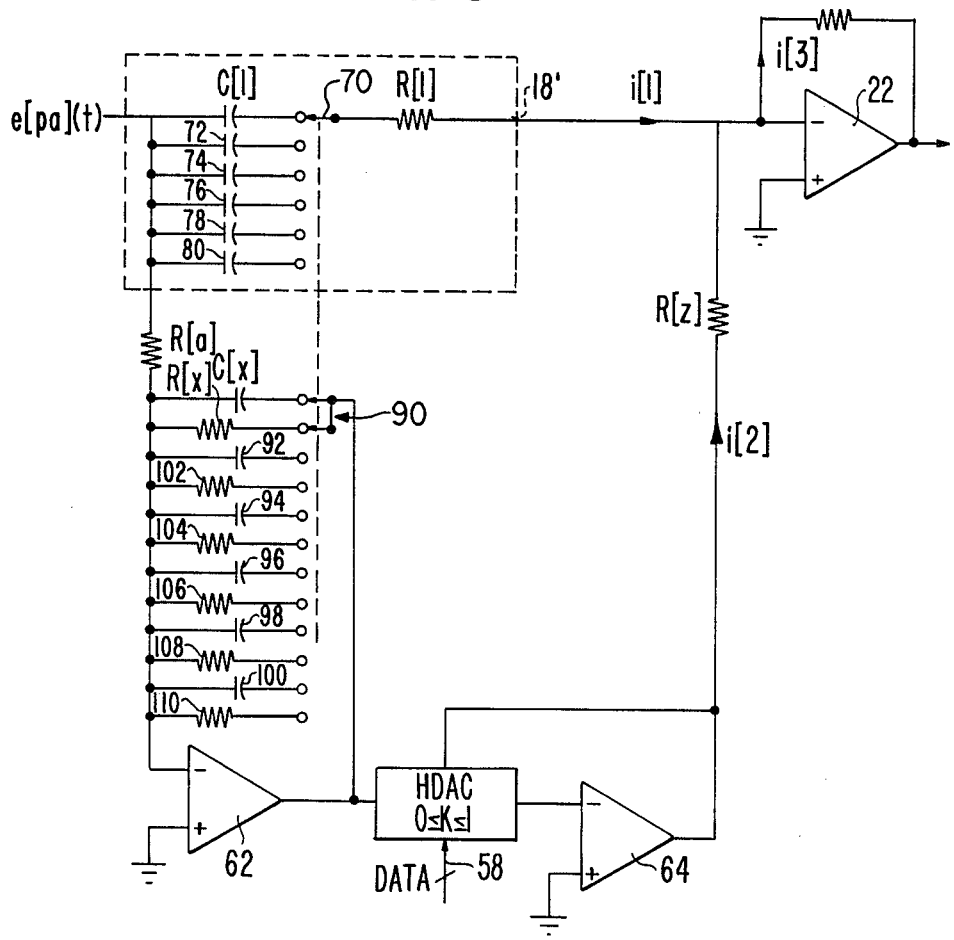
FIG. 8 is a circuit diagram of a still further preferred embodiment of the pole-zero network of FIG. 6.

Pole-zero network 46 comprises an electronically controlled attenuation element. Although pole-zero network 46 might be implemented in several different ways, two preferred embodiments of pole-zero network 46 are illustrated in FIGS. 7 and 8. The embodiment of pole-zero network 46 illustrated in FIG. 7 comprises a Multiplying Digital To Analog Converter (MDAC) 60, input buffer amplifier 62, output buffer amplifier 64, and resistors R[a], R[z], and R[x]. Resistor R[a] is coupled between the input of high pass filter 18 and the summing input of buffer amplifier 62. Resister R[x] is provided as a feedback resister for buffer amplifier 62. Buffer amplifier 62 is connected as an input buffer amplifier to MDAC 60, the output of which is coupled to the summing input terminal of output buffer amplifier 64. The output of buffer amplifier 64 is coupled through resistor R[z], to the summing input of amplifier 22. The attenuation value "K" of MDAC 60, namely the resistance of MDAC 60, is controlled by a digital signal from control signal circuit 44 over line 58.

As was discussed above, an input pulse e[pa](t) is provided from the output of preamplifier 16, wherein:

$$e[pa](t) = E[\max] * \exp(-t/T[pa]), \qquad (11)$$

and $$E[pa](s) = \frac{E[\max]}{s + 1/T[pa]}. \qquad (12)$$

The current I[1](s) through high pass filter 18 may be expressed as:

$$I[1](s) = \frac{E(\max) * s}{R[1] * (s + 1/T[pa]) * (s + 1/T[1])} \qquad (13)$$

whereby the actual current i[1](t) through high pass filter 18 may be expressed as:

$$i[1](t) = \qquad (14)$$

-continued
$$\frac{E[max]*(T[pa]*\exp(-t/T[1]) - T[1]*\exp(-t/T[pa]))}{R[1] * (T[pa] - T[1])},$$

Proper pole-zero cancellation is achieved when:

$$I[3](s) = I[1](s) + I[2](s) = \frac{K[r] * E[max]}{s + 1/T[1]}, \quad (16)$$

Thus, the input control signal over line 58 to MDAC 60 must operate to adjust the value K of MDAC 60 to meet the criteria of equation 16 or 17. This is achieved by developing the input control signal over line 58 as a function of the sampling performed by sampling circuit 42, which in turn represents the mean average of the undershoot and overshoot of the trailing edges of the random pulses validly detected by system 10.

Given the specific embodiment of pole-zero network 46 illustrated in FIG. 7, the current I[2](s) through network 46 may be represented as follows:

$$I[2](s) = \frac{E[max] * K * R[x]}{R[a] * R[z] * (s + 1/T[pa])}, \quad (18)$$

and $$i[2](t) = \frac{E[max] * K * R[x] * \exp(-t/T[pa])}{R[a] * R[z]}. \quad (19)$$

Let $$A = \frac{K * R[x] * R[1]}{R[a] * R[z]}, \quad (20)$$

then $$I[3](s) = \frac{E[max]*(1 + A)* s + (1/T[1])*(A/(1 + A))}{R[1] * (s + 1/T[pa]) * (s + 1/T[1])}. \quad (21)$$

In this case, pole-zero cancellation is achieved when:

$$T[pa] = T[1] * (1 + A)/A, \text{ or} \quad (22)$$

$$A = T[1]/(T[pa] - T[1]), \text{ and} \quad (23)$$

$$K = \frac{T[1] * R[a] * R[z]}{R[1] * R[x] * (T[pa] - T[1])}. \quad (24)$$

Thus, $$I[3](s) = \frac{E[max] * T[pa]}{R[1] * (T[pa] - T[1]) * (s + 1/T[1])}, \quad (25)$$

and $$i[3](t) = \frac{E[max] * T[pa] * \exp(-t/T[1])}{R[1] * (T[pa] - T[1])}. \quad (26)$$

The preferred embodiment of pole-zero network 46 illustrated in FIG. 8 includes the addition of a capacitor C[x] in parallel with resistor R[x]. The existence of this capacitor establishes a real pole T[x]=R[x] * C[x] in the signal path of network 46. This pole may be set to coincide with the real pole in high pass filter 18'. This configuration allows the use of relatively slow, commercially available low noise operational amplifiers 62 and 64, thus providing a significant commercial advantage over the embodiment illustrated in FIG. 7.

In the embodiment of network 46 illustrated in FIG. 8, high pass filter 18' includes a switch 70 and a plurality of additional capacitors 72, 74, 76, 78 and 80 which may be selectively coupled by switch 70 to change the effective real pole of high pass filter 18'. Thus, system 10 in this configuration includes a first mechanism for changing the real pole of the high pass filter of that system. In accordance with the present invention, a second mechanism is provided, responsive to operation of the first mechanism, for correspondingly changing the real pole in the signal path of the pole-zero network. As shown in FIG. 8, by way of example and not limitation, a double pole, switch 90 is provided along with a plurality of capacitors 92, 94, 96, 98, 100 and a plurality of corresponding resistors 102, 104, 106, 108 and 110. Switches 70 and 90 are ganged together so that a change in the position of switch 70 results in a corresponding change of both poles of switch 90. With resistor R1 set at approximately 700 ohms and capacitor C[1] set at 150 pF, the resultant time constant is approximately 0.5 µs. With these settings, R[x] may be set at 80 K ohms and C[x] set at 240 pF. Corresponding, capacitor 72 may have a value of 1,000 pF for a time constant of 1 µs and corresponding capacitor 92 and resistor 102 may have values of 510 PF and 40 K ohms.

For time constants of 2 µs, 3 µs, 6 µs and 10 µs, capacitors 74, 76, 78 and 80 have corresponding values of 2,000 pF, 3,000 pF, 6,000 pF and 10,000 pF; capacitors 94, 96, 98 and 100 have corresponding values of 1,000 pF, 1,500 pF, 3,000 pF, and 5,100 pF; and resistors 102, 104, 108 and 100 have corresponding values of 20 K ohms, 10.87 K ohms, 4.17 K ohms and 1.47 K ohms. With these illustrative values, buffer amplifiers 62 and 64 may comprise model OP-27 operational amplifiers and MDAC 60 may comprise a model AD 7541A.

Figure 9:
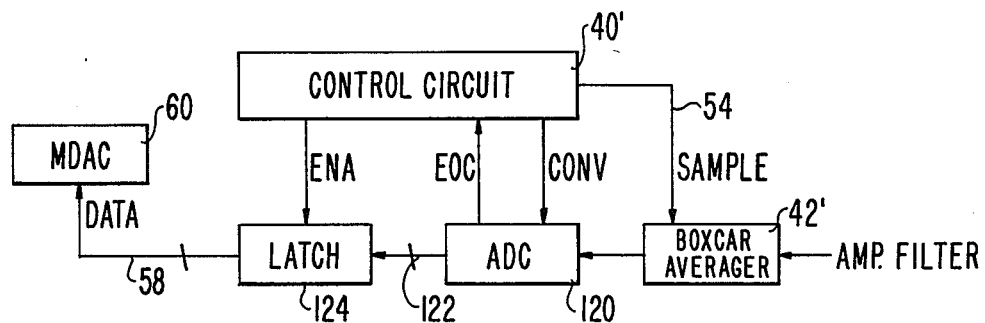
FIG. 9 is a block diagram of one embodiment of the control signal circuit illustrated in FIG. 6.
Figure 10:
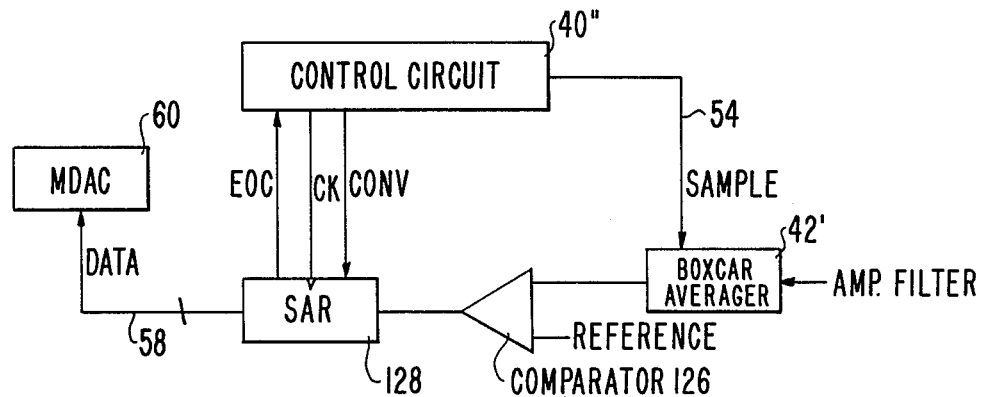
FIG. 10 is a block diagram of an alternative embodiment of the control signal circuit illustrated in FIG. 6.
Figure 11:
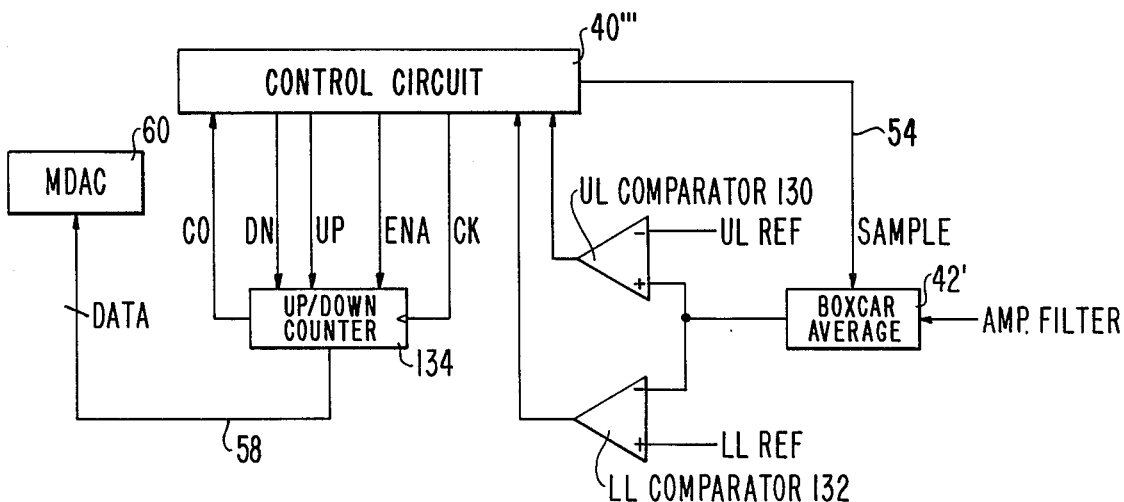
FIG. 11 is still a further preferred embodiment of the control signal circuit of FIG. 6.

FIGS. 9, 10 and 11 illustrate three alternative preferred embodiments of the control circuit 40, sampling circuit 42 and control signal circuit 44 of FIG. 6. In the embodiment of FIG. 9, sampling circuit 42 is represented by boxcar averager 42' and control signal circuit 44 is illustrated as comprising analog-to-digital converter 120 and latch 124. The output of boxcar averager 42' is coupled to the input of analog-to-digital converter 120, the output of analog-to-digital converter 120 is coupled to the input of latch 124, and the output of latch 124 is coupled, over line 58, to the input of MDAC 60. Analog-to-digital converter 120 requires a control signal CONV from control circuit 40' which indicates when an analog-to-digital conversion is required. Analog-to-digital converter 120 provides a control signal EOC to control circuit 40' indicating when analog-to-digital converter 120 has completed the requisite analog-to-digital conversion. Control circuit 40' must also provide a control signal ENA to latch 124 which enables latch 124 at the appropriate time for operation of MDAC 60. Analog-to-digital converter 120 converts the digital value of the error voltage produced from boxcar averager 42'. The resultant digital output from analog-to-digital converter 120 is fed through transparent latch 124 to MDAC 60. Latch 124 holds the last digital value when the pole-zero cancellation process terminates. Thus, MDAC 60 is provided digital data from the output of latch 124, which data operates to set MDAC 60 at a value which tends to cancel, by operation of pole-zero network 46, undershoot in system 10.

An LED indicator (not shown) may be provided to show that an error signal is continued to be generated by boxcar averager 42' and this indicator may be turned off when no additional processing is required to complete cancellation, namely, when network 46 has operated to cancel undershoot in system 10. In the alternative, network 46 may be made operational by manual closure of a switch (not shown) by the system operator. When the switch is closed, boxcar averager 42' is operational to control the setting of MDAC 46 and, with the switch open, the continued adjustment of MDAC is terminated. This switch may, for example, be located in the connecting line 122 between analog-to-digital converter 120 and latch 124. In the embodiment of FIG. 10, control signal circuit 44 comprises a comparator 126 and a successive approximation register (SAR) 128. The output of boxcar averager 42' is connected to an input of comparator 126, whereas a second input of comparator 126 is provided with a reference signal. The output of comparator 126 is coupled to an input of SAR 128 and the output of SAR 128 is coupled, by line 58, to the input of MDAC 60.

Comparator 126 samples the error voltage produced by boxcar averager 42' and compares this voltage to a reference. SAR 128 is used to test a "one" in each bit position of MDAC 60, successively, from the most significant bit to the least significant bit of MDAC 60. Depending upon the level of the quantized error signal from comparator 126, the present bit being tested is either maintained at a "one" or is set to a "zero" for the next trial. The process terminates when each bit in the MDAC has been tested once. Control circuit 40'' is simply required to generate a control signal CONV indicating when SAR 128 is to sample the output of comparator 126, and SAR 128 provides an end of conversion, EOC control signal, back to control circuitry 40'. Signal CK is a clock signal from circuit 40'' to SAR 128.

The embodiment of control signal circuit 44 illustrated in FIG. 11 includes an upper level comparator 130, a lower level comparator 132, and an up/down counter 134. The output of boxcar averager 42' is coupled to the positive input of upper level comparator 130 and to the negative input of lower level comparator 132. An upper level reference is provided to the negative input terminal of comparator 130 and a lower level reference is provided to the positive input terminal of comparator 132. The outputs of comparators 130 and 132 are provided to control circuitry 40'''. Comparators 130 and 132 together comprise a window comparator which samples the error voltage produced by boxcar averager 42' and compares this voltage with the window reference values indicated by the upper level reference and the lower level reference provided to comparators 130 and 132, respectively. These window reference values determine the acceptable bounds of the error signal. Up/down counter 134 is coupled to receive an enable signal ENA from control circuit 40''' and a corresponding up count signal UP or a down count signal DN if the error signal generated by comparators 130 and 132 exceeds the window limits. If the error signal is within the window limits, the counter is not changed and the pole-zero process terminates, having the proper adjustment.

Up/down counter 134 is enabled upon receipt of enable signal ENA from control circuit 40''' and up down counter 134 provides a completion signal CO to control circuit 40''' upon completion of the up/down count. The up/down counter 134 is provided with a clock signal CK from the control circuit 40''' after one or more samples of the baseline following receipt of a signal by the boxcar averager 42'. The control circuit 40''' includes a divide by n counter to allow the boxcar averager 42' to average n samples before providing a clock signal to the up/down counter. A large value of n reduces the probability of prematurely terminating the pole-zero process when sampling a low amplitude signal with a corresponding small amplitude tail. The maximum time needed to complete the pole-zero process is determined by the maximum dynamic range of the MDAC 60' divided by the count rate of the amplifier signals times the value of n in the control circuit 40'''. The maximum time required with n equal one using a 12-bit MDAC and a minimum count rate of 100 counts per second is 40 seconds. As implemented a value of four was chosen to limit the maximum time of adjustment to less than 3 minutes for the given conditions. The output of up down counter 134 is provided as a digital input control signal over line 58 to MDAC 60.

As should be readily apparent to one skilled in the art given the above descriptions, the actual content of control circuit 40', 40'' and 40''', comprises simple standard control technology necessary to operate a latch, a successive approximation register, or an up/down counter in a conventional manner.

Control circuit 40 of FIG. 6 and the corresponding control circuits 40', 40'', and 40''' of FIGS. 9, 10 and 11 preferably contain logic circuitry to determine if an event was valid, i.e., not overloaded and not piled up. This logic circuitry also determines the timing and duration of the sampling process for sampling circuit 42, namely, boxcar averager 42' of FIGS. 9, 10 and 11. In addition, the control circuits preferably control the number of valid boxcar averager samples required prior to the next incremental trial value for appropriate attenuation in pole-zero network 46, and these circuits determine when the pole-zero process terminates. As noted above, an LED indicator may be employed to indicate when the pole-zero cancellation process is in effect and the indicator may be turned off when that process is completed. Again, the specific implementation of this type circuitry should be well understood to one skilled in the art, given the foregoing descriptions.

The automatic pole-zero adjustment circuit described above employs use of digital conversion which permits the requisite fine adjustment of a pole-zero network to achieve pole-zero cancellation. The amplitude of the resultant random pulses in system 10 preferably are measured to an accuracy on the order of one part in ten thousand and adjustment of undershoot may be achieved, in accordance with the teachings of the subject invention, on this same order of accuracy. The use of a pole-zero network which includes a real pole corresponding to the real pole of the high pass filter of the system itself permits the utilization of relatively inexpensive amplifiers as input and output buffers to an MDAC, resulting in a sufficiently stable and fast pole-zero network to achieve the objective of automatically cancelling undershoot in the resultant random pulses of the system.

Additional advantages and modifications will readily occur to those skilled in the art. The invention in its broader aspects is not, therefore, limited to the specific details, representative methods and illustrative examples shown and described. Accordingly, departures may be made from such details without departing from the spirit or scope of applicants' generic inventive concept.

We claim:

1. An automatic pole-zero adjustment circuit for an ionizing radiation spectroscopy system comprising:
   a high pass filter;

pole-zero network means, coupled to said high pass filter and having a resistance which varies as a function of an input control signal, for permitting pole-zero adjustment of said system, said pole-zero network means comprising a Multiplying Digital-To-Analog Converter (MDAC);

sampling means, coupled to said system for sampling a segment of the trailing edge of random pulses passing through said system; and control signal means, coupled to said MDAC, for generating said input control signal as a function of said sampling to permit cancellation by said pole-zero network of undershoot in said system.

2. An automatic pole-zero adjustment circuit of claim 1 wherein said sampling means comprises a boxcar averager circuit.

3. An automatic pole-zero adjustment circuit of claim 1 wherein said pole-zero network means includes an input buffer amplifier coupled to the input of said MDAC and an output buffer amplifier coupled to the output of said MDAC.

4. An automatic pole-zero adjustment circuit of claim 3 wherein said pole-zero network means includes a circuit coupled to said input buffer amplifier having a time constant equal to the time constant of said high pass filter.

5. An automatic pole-zero adjustment circuit of claim 4 wherein said system includes first means for selectively changing the time constant of said high pass filter and wherein said pole-zero network means includes second means, responsive to operation of said first means, for correspondingly changing the time constant of said circuit coupled to said input buffer.

6. An automatic pole-zero adjustment circuit of any one of claims 1, 2, and 3 through, inclusive, wherein said control signal means provides a digitalized input control signal for said pole-zero network means.

7. An automatic pole-zero adjustment circuit of claim 6 wherein said control signal means comprises a latch.

8. An automatic pole-zero adjustment circuit of claim 6 wherein said control signal means comprises a successive approximation register.

9. An automatic pole-zero adjustment circuit of claim 6 wherein said control signal means comprises an up/down counter.

10. An automatic pole-zero adjustment circuit for an ionizing radiation spectroscopy system which has a real pole of a high pass filter in the signal path of said system, said circuit comprising:

pole-zero network means, coupled to said system, for permitting pole-zero adjustment of said system in response to an input control signal, said network means including a real pole in the signal path of said network means set coincident with said real pole of said high pass filter, said pole-zero network means comprising an input buffer amplifier, a Multiplying Analog-To-Digital Converter (MDAC) and an output buffer connected in series with one another;

sampling means, coupled to said system, for sampling a segment of the trailing edge of random pulses passing through said system; and control signal means, coupled to said sampling means, for generating said input control signal as a function of said sampling to permit cancellation by said pole-zero network means of undershoot in said system.

11. An automatic pole-zero adjustment circuit of claim 10 wherein said input buffer amplifier includes a circuit to establish said real pole in said signal path of said network means.

12. An automatic pole-zero adjustment circuit of claim 11 wherein said system includes first means for changing said real pole of said high pass filter and wherein said network means includes second means, responsive to the operation of said first means, for correspondingly changing said real pole in said signal path of said network means.

* * * * *

REEXAMINATION CERTIFICATE (3856th)

United States Patent [19]
Britton, Jr. et al.

[11] B1 4,866,400
[45] Certificate Issued  Aug. 31, 1999

[54] AUTOMATIC POLE-ZERO ADJUSTMENT CIRCUIT FOR AN IONIZING RADIATION SPECTROSCOPY SYSTEM

[75] Inventors: Charles L. Britton, Jr., Alcoa; Thomas H. Becker; Michael O. Bedwell, both of Knoxville, all of Tenn.

[73] Assignee: EG&G Instruments, Inc.

Reexamination Request:
No. 90/004,986, May 13, 1998

Reexamination Certificate for:
Patent No.: 4,866,400
Issued: Sep. 12, 1989
Appl. No.: 07/144,119
Filed: Jan. 15, 1988

[51] Int. Cl.⁶ ..................................................... H03F 1/00
[52] U.S. Cl. ........................... 330/305; 250/369; 327/552
[58] Field of Search ................................... 330/107, 305; 250/369, 370.01, 389; 327/552, 553

[56] References Cited

U.S. PATENT DOCUMENTS 4,481,466  11/1984  Roos et al. ................................ 330/107
4,491,799  1/1985  Giardinelli .................................. 330/2

OTHER PUBLICATIONS

Nowlin et al., "Elimination of Undesirable Undershoot I in the Operation and Testing of Nuclear Pulse Amplifiers", Rev. Sci. Instr., vol. 36, No. 12, Dec. 1965, pp. 1830–1839.
Casoli et al., "Active Pole–Zero Cancellation Feedback Loop to Enhance High–Rate Performances of Nuclear Spectroscopy Systems," Nucl. Inst. And Meth., vol. 156, 1978, pp. 559–566.

Cora et al., "Automated Regulation of Critical Parameters and Related Design Aspects of Spectroscopy Amplifiers with Time–Invariant Filters," IEEE Trans. On Nucl. Sci., NS–29(1), Feb. 1982, pp. 609–613.
Bryson, P.R., "How to Apply Multiplying DACs", Machine Design, Feb. 20, 1986, pp. 30, 32–34.
Landers, G., "Trimming Circuits Electronically", Machine Design, May 26, 1983, pp. 47–51.
Wells, F.D., et al., "Regulator to Control Current Sharing Among Parallel–Connected Power Transistors", IEEE Transactions on Nulcear Science, vol. NS–30, No. 4, Aug. 1983, pp. 2935–2937.
"CMOS DAC Application Guide", 2nd Edition, Analog Devices pp. 1–61.
"Model 972 Amplifier Operating Manual", EG&G Ortec, pp. 1–44.

*Primary Examiner*—James B. Mullins

[57] ABSTRACT

An automatic pole-zero adjustment circuit is provided for an ionizing radiation spectroscopy system which comprises a pole-zero network circuit, coupled to the system and having an electrical chracteristic which varies as a function of an input control signal, for permitting pole-zero adjustment of the system; a sampling circuit coupled to the system, for sampling a segment of the trailing edge of random pulses passing through the system; and a control signal circuit coupled to the sampling circuit, for generating the input control signal as a function of the sampling to permit cancellation by the pole-zero network circuit of undershoot in the system. The pole-zero network circuit may include a real pole in the signal path of the network circuit set coincident with the real pole of a high pass filter in the system itself. The control signal provided to the pole-zero network circuit is digitized.

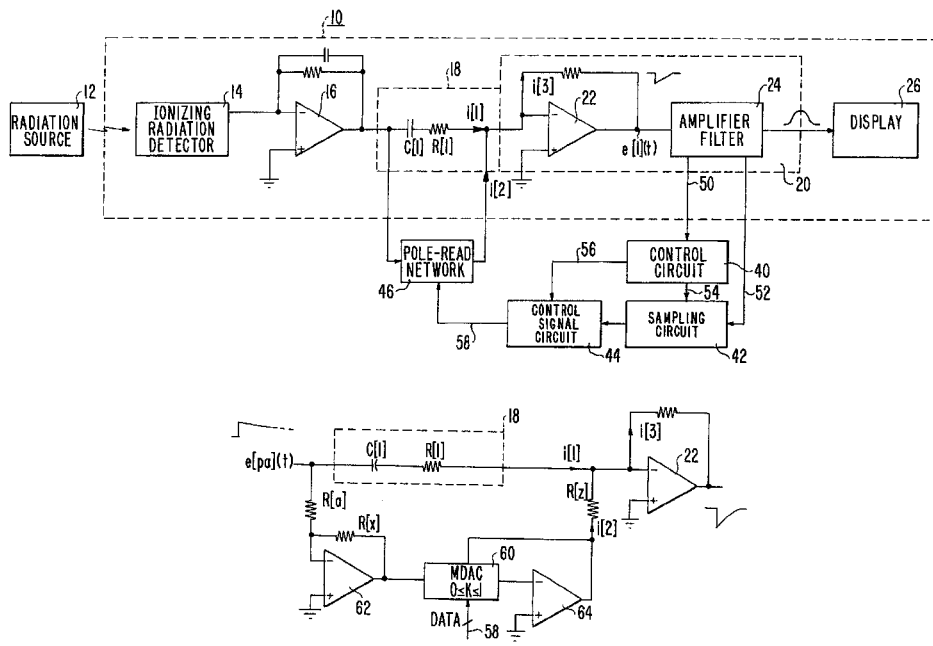

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1–12 is confirmed.

\* \* \* \* \*